United States Patent [19]
Watanabe

[11] Patent Number: 6,003,595
[45] Date of Patent: Dec. 21, 1999

[54] CONSTANT-TEMPERATURE LIQUID-CIRCULATING APPARATUS

[75] Inventor: Mitsuhiro Watanabe, Ibaraki, Japan

[73] Assignee: SMC Corporation, Tokyo, Japan

[21] Appl. No.: 09/013,899

[22] Filed: Jan. 27, 1998

[30] Foreign Application Priority Data

Feb. 7, 1997 [JP] Japan ................................. 9-40086

[51] Int. Cl.$^6$ .................................................. G05D 23/00
[52] U.S. Cl. ...................... 165/299; 165/300; 165/263; 165/264
[58] Field of Search ...................... 165/108, 299, 165/300, 263, 264

[56] References Cited

U.S. PATENT DOCUMENTS

| | | | |
|---|---|---|---|
| 1,346,251 | 7/1920 | Rathbone | 165/299 |
| 1,432,281 | 10/1922 | Ehrhart | 165/300 |
| 1,654,544 | 1/1928 | Hulse | 165/299 |
| 3,195,620 | 7/1965 | Steinhardt, Jr. | 165/263 |
| 3,323,578 | 6/1967 | Hermann | 165/263 |
| 3,370,454 | 2/1968 | Flores | 165/108 |
| 3,373,801 | 3/1968 | Weaver | 165/300 |
| 3,493,037 | 2/1970 | Haake . | |
| 3,666,003 | 5/1972 | Clark, Jr. et al. | 165/299 |
| 3,672,444 | 6/1972 | Lowe | 165/299 |
| 3,730,260 | 5/1973 | Raymond | 165/299 |
| 3,777,802 | 12/1973 | Young | 165/299 |
| 4,046,189 | 9/1977 | Clark, Jr. | 165/299 |
| 4,712,607 | 12/1987 | Lindenmans et al. | 165/263 |
| 4,883,115 | 11/1989 | Johanson et al. | 165/299 |
| 5,052,472 | 10/1991 | Takahashi et al. | 165/299 |
| 5,143,149 | 9/1992 | Kronberg | 165/300 |
| 5,435,379 | 7/1995 | Moslehi et al. . | |

FOREIGN PATENT DOCUMENTS

| | | |
|---|---|---|
| 0 441 710 | 8/1991 | European Pat. Off. . |
| 2 636 880 | 3/1990 | France . |
| 10-141831 | 5/1998 | Japan . |

Primary Examiner—Ira S. Lazarus
Assistant Examiner—Terrell McKinnon
Attorney, Agent, or Firm—Oblon, Spivak, McClelland, Maier & Neustadt, P.C.

[57] ABSTRACT

A cylindrical casing 33 is provided in a tank 25 in which a pump 14 and a heat exchanger 15 are assembled. A heater 12 is mounted at the top of the tank 25 in such a way that its heating section 12a is inserted into the casing 33. A constant-temperature liquid is fed from an inlet 36 at the lower end of the casing 33, fills the inside of the casing 33, and then flows out from the outlet 37 at the upper end, while it is simultaneously heated by the heater 12.

5 Claims, 5 Drawing Sheets

# CONSTANT-TEMPERATURE LIQUID-CIRCULATING APPARATUS

FIELD OF THE INVENTION

The present invention relates to a constant-temperature liquid-circulating apparatus for supplying a load with a constant-temperature liquid maintained at a constant temperature.

PRIOR ART

In, for example, a semiconductor fabrication apparatus, a constant-temperature liquid maintained at a constant temperature is cyclicly supplied to maintain the apparatus (load) at a constant temperature. FIG. 8 shows an example of a publicly known constant-temperature liquid-circulating apparatus. This constant-temperature liquid-circulating apparatus 1 comprises a circulating circuit 3 for cyclicly supplying a constant-temperature liquid 5 in a tank 13 to a load 2, and a refrigerating circuit 4 for cooling the constant-temperature liquid 5 that has increased in temperature due to the cooling of the load 2.

The circulating circuit 3 comprises the tank 13 in which the constant-temperature liquid 5 is accommodated; a heater 12 that heats the constant-temperature liquid in the tank to a predetermined temperature; a pump 14 that cyclicly supplies the constant-temperature liquid to the load 2; and a heat exchanger 15 for cooling the constant temperature liquid 5 that has increased in temperature due to the cooling of the load 2, wherein these components are sequentially connected in series through the use of piping 16. The tank 13 has a temperature sensor 17 near its outlet. A temperature controller 18 compares the temperature detected by the temperature sensor 17 to the set temperature and controls the heater 12 to adjust the detected temperature to the set value.

On the other hand, the refrigerating circuit 4 comprises a compressor 6 that compresses an appropriate refrigerant into a gas with a high temperature and a high pressure; a condenser 7 that cools and condenses this gas into a refrigerant liquid with a high pressure; a pressure-reducing device (in the illustrated example, a pressure-reducing valve) that reduces the pressure and temperature of the refrigerant liquid; an evaporator 9 that evaporates the refrigerant liquid, the pressure of which has been reduced; and an accumulator 10, all of which are sequentially connected in series. The refrigerating circuit 4 also includes an overheat prevention circuit 11 that directly returns the refrigerant that has been compressed by the compressor 6, to the accumulator 10 when a large load is applied to the evaporator 9; and an overheat prevention valve 11a in the circuit. The overheat prevention valve 11a opens and closes the overheat prevention circuit 11 using a temperature sensor 11b that detects the temperature on the upstream side of the accumulator 10.

In the publicly known constant-temperature liquid-circulating apparatus 1 of the above configuration, since the constant-temperature liquid 5 that has increased in temperature due to the cooling of the hot load 2 is cooled by the heat exchanger 15 and then heated up to the set value by the heater 12, the temperature of the constant-temperature liquid cyclicly supplied to the load can be maintained at the set value.

On the contrary, since the tank 13, pump 14, and heat exchanger 15 are individually installed and connected using piping 16 such as synthetic resin tubes or metal pipes, the entire apparatus is large and requires a large number of assembly operations, thereby increasing costs and the required installation space. Attention must also be paid to leakage from the connection between each device and the piping 16.

To solve this problem, the inventor has proposed in Japanese Patent Application Laid Open No. 8-316949 a constant-temperature liquid-circulating apparatus incorporating the heat exchanger 15, heater 12, and pump 14 in a tank 25.

This improved constant-temperature liquid-circulating apparatus 21 comprises a circulating circuit 3 for cyclicly supplying a constant-temperature liquid 5 in the tank 13 to the load 2, and a refrigerating circuit 4 for cooling the constant-temperature liquid 5 that has increased in temperature due to the cooling of the load 2, as shown in FIGS. 9 and 10.

The tank 25 has a heater 12 for heating a constant-temperature liquid 5 and a pump 14 for supplying a constant-temperature liquid to the load, both of which are mounted on the top surface of the tank, and also has a heat exchanger 15 that cools the constant-temperature liquid 5 using the evaporator 9 in the refrigerating circuit 4, a heat-generating section 12a in the heater 12 that is curved in an "L" shape, and a pump head 29 containing the suction port 14a and ejection port 14b of the pump 14, all of which are accommodated in the tank.

A supply port 26a for feeding the constant-temperature liquid into the tank 25 is provided in the upper part of one side of the tank 25, and a drainage port 26b that is opened and closed by a valve 27 is provided in the lower part of this side. The overall outer circumferential surface of the tank is covered with an appropriate insulating material. Reference numeral 28 in FIG. 9 designates a level gauge that detects the level of the constant-temperature liquid in the tank 25.

The pump 14 includes the pump head 29 immersed in the constant-temperature liquid 5; and a motor 30 mounted on the top surface of the tank 25. The suction port 14i aof the pump head 29 is opened into the constant-temperature liquid 5, and the ejection port 14b is connected to an inlet 2a of the load 2 by piping 16a. In addition, an outlet 2b of the load 2 is connected to an inlet 1a of the heat exchanger 15 through the use of piping 16b, and an outlet 15b of the heat exchanger 15 is directly opened into the tank 25 so that the constant-temperature liquid cooled by the evaporator 9 of the heat exchanger 15 is directly ejected from the outlet 15b into the tank.

The circulating circuit 3 also includes a temperature sensor 17 that is located near the ejection port 14b of the pump head 29 and detects the temperature of the constant-temperature liquid 5, and the temperature controller 18 controls the heater 12 to maintain the detected temperature of the constant-temperature liquid detected by the temperature sensor 17 at a set value.

In addition, although not specifically shown, each device in the refrigerating circuit 4 other than the evaporator 9 is installed in the lower part of a frame 20, while the tank 25 is installed in the upper part.

Since the improved constant-temperature liquid-circulating apparatus 21 of such a configuration incorporates a heat exchanger 15, heater 12, and pump 14 in the tank 25, these devices need not be connected together by piping such as tubes or pipes, thereby advantageously reducing the size of the apparatus to significantly reduce the required installation space compared to the publicly known constant-temperature liquid-circulating apparatus 1 shown in FIG. 8. In addition, this configuration reduces the number of assembly operations to allow the apparatus to be easily assembled, thereby reducing costs. Furthermore, with this configuration there is little need to install or remove the piping during maintenance, thereby enabling maintenance to be performed easily and preventing leakage from the piping connections.

If, however, the heater 12 is large and the heat-generating section 12a is curved, the heater will be expensive. If, for example, the heat-generating section 12a is formed so as to be linear to reduce the cost of the heater, the level of the constant-temperature liquid must be increased to reliably immerse the entire heat-generating section 12a in the constant-temperature liquid 5, thereby in creasing the amount of constant-temperature liquid used. Complete fluorine liquid, which is very expensive, is normally used as the constant-temperature liquid, so initial costs are high if it is necessary to use a large amount of constant-temperature liquid.

In addition, if the level of the constant-temperature liquid decreases for any reason, unloaded heating by the heater or an excessive temperature increase may open-circuit the heat-generating section, so the level of the constant-temperature liquid must be precisely controlled, requiring a large amount of time and labor to manage the constant-temperature liquid.

Although only the tip of the heater 12 can be used as the heat-generating section 12a, the level of the constant-temperature liquid must still be precisely controlled, and a sufficient amount of heat cannot be obtained unless the size of the heater 12 is increased, thus complicating manufacture and installation.

DISCLOSURE OF THE INVENTION

It is a major object of this invention to provide a constant-temperature liquid-circulating apparatus for cyclicly supplying a constant-temperature liquid to a load, wherein the temperature of the constant-temperature liquid is reliably controlled by a heater, regardless of the level of the constant-temperature liquid in the tank.

It is another object of this invention to provide a constant-temperature liquid-circulating apparatus that heats the constant-temperature liquid using a heater of a simple and inexpensive configuration.

It is yet another object of this invention to provide a constant-temperature liquid-circulating apparatus that reduces the amount of constant-temperature liquid used, and thus initial costs.

It is still another object of this invention to provide a constant-temperature liquid-circulating apparatus that is compact and that is easy to maintain.

To achieve the objects, the constant-temperature liquid-circulating apparatus according to this invention is characterized in that the apparatus incorporates a pump and a heat exchanger in a tank in which a constant-temperature liquid is accommodated, in that a casing that defines a heat chamber is mounted in the apparatus, in that a heater is mounted at the top of the tank in such a way that its heat-generating section is inserted into the casing, and in that an inlet for the constant-temperature liquid is provided at the lower end of the casing, with an outlet provided at the upper end.

In this invention with the above configuration, when fed into the casing from the inlet at its lower end, a constant-temperature liquid fills the inside of the casing and then flows out from the outlet at the upper end, while it is simultaneously heated by the heater. This configuration enables the constant-temperature liquid to be fed into the casing to fill it, regardless of the level of the constant-temperature liquid in the tank, and to be reliably heated by the heater, thereby preventing the heater from being open-circuited due to unloaded heating or an excessive temperature increase. Furthermore, this invention can reduce the amount of expensive constant-temperature liquid used, thereby reducing initial costs. In addition, a compact constant-temperature liquid-circulating apparatus that is easy to maintain can be obtained by incorporating the pump, heat exchanger, and heater in the tank.

According to a specific embodiment of this invention, the casing is cylindrical in shape and is mounted on the bottom surface of the tank in such a way that its upper end protrudes from the level of the constant-temperature liquid, and a small hole is provided at the lower end of the casing to allow the casing to communicate with the tank. The heat-generating section of the heater is linear and is vertically inserted into the casing from above.

When the operation of the apparatus is stopped, the small hole at the lower end of the casing is used to discharge the constant-temperature liquid from the casing.

According to a specific preferred embodiment of this invention, a pump head containing the suction port of the pump is disposed near the bottom surface of the tank, and a small amount of constant-temperature liquid is accommodated in the tank in such a way that its level is not more than half the height of the casing.

This configuration allows the tank to have a sufficient capacity to reliably accommodate the constant-temperature liquid inside external piping and devices in the tank during maintenance.

According to one embodiment of this invention, the inlet of the casing is connected to the heat exchanger, and its outlet is opened into the tank so that the constant-temperature liquid is cooled by the heat exchanger, fed into the casing from the inlet, heated by the heater, and then overflows into the tank.

In this case, a level sensor for detecting the level of the constant-temperature liquid is preferably mounted on the casing so that the heater is turned on when the constant-temperature liquid is supplied to the casing, and so that it is otherwise turned off. This configuration enables the heater to be turned off to reliably prevent unloaded heating or an excessive increase in temperature if the level of the constant-temperature liquid in the casing decreases due to any unforseen accident, or if the operation of the apparatus is stopped to discharge the constant-temperature liquid from the casing into the tank.

According to another embodiment of this invention, the inlet of the casing is connected to the pump and the outlet is connected to the load, thereby enabling the constant-temperature liquid with its temperature controlled in the casing to be directly supplied to the load.

DETAILED DESCRIPTION

Figure 1:
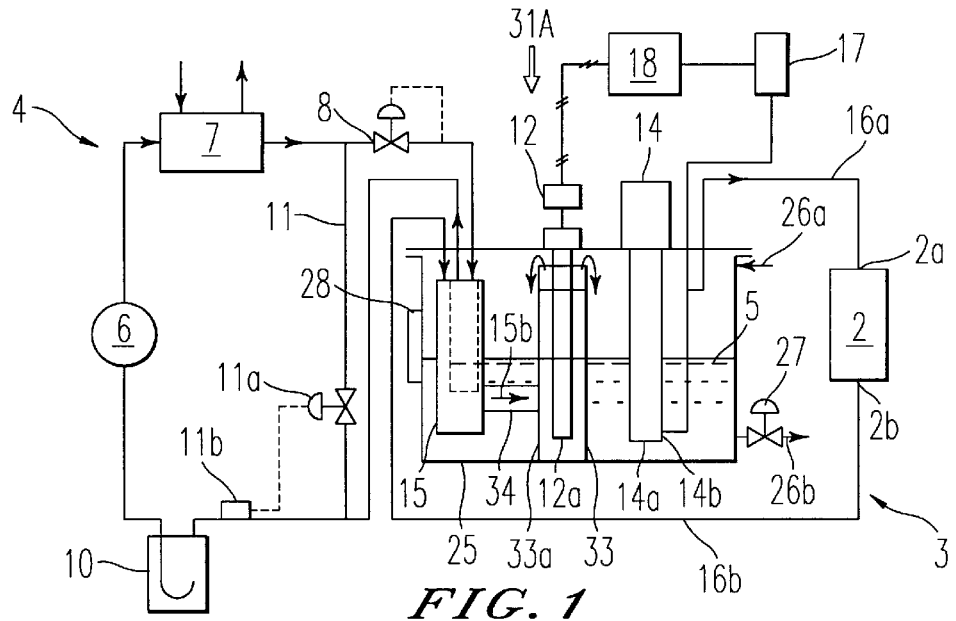
FIG. 1 is a cross-sectional view showing an overall configuration of a first embodiment of this invention.
Figure 2:
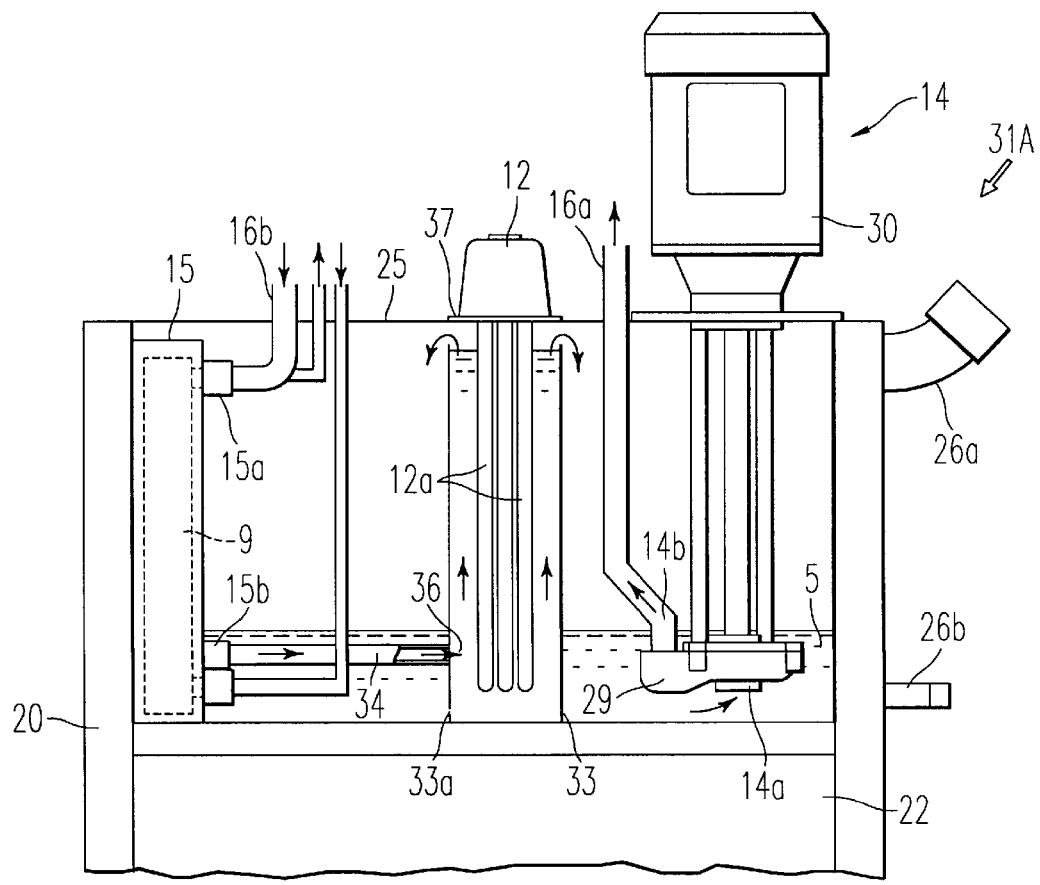
FIG. 2 is a cross-sectional view showing an enlarged integral part of FIG. 1.
Figure 9:
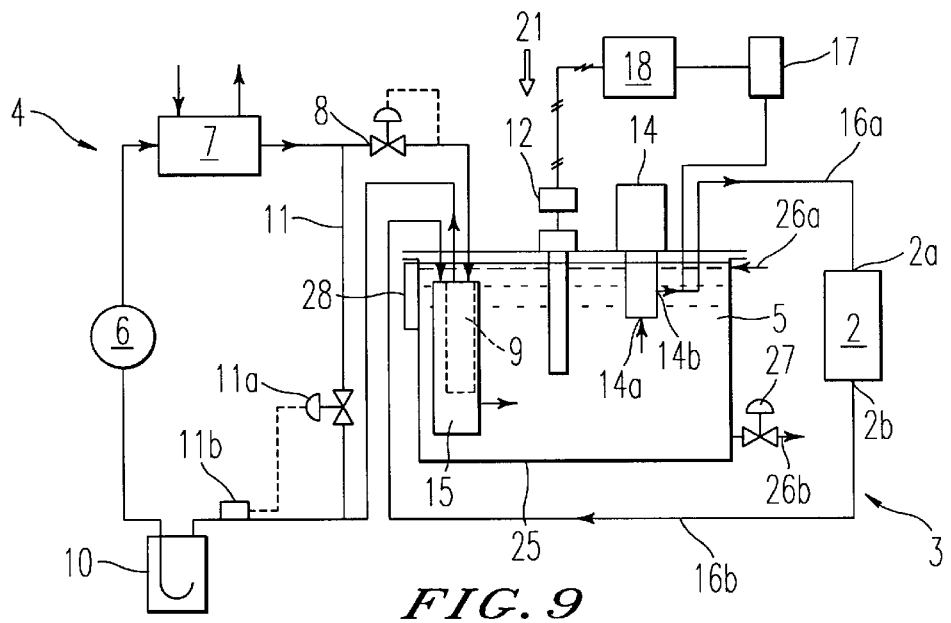
FIG. 9 is a cross-sectional view showing an overall configuration of a proposed improved refrigerant-circulating apparatus.
Figure 10:
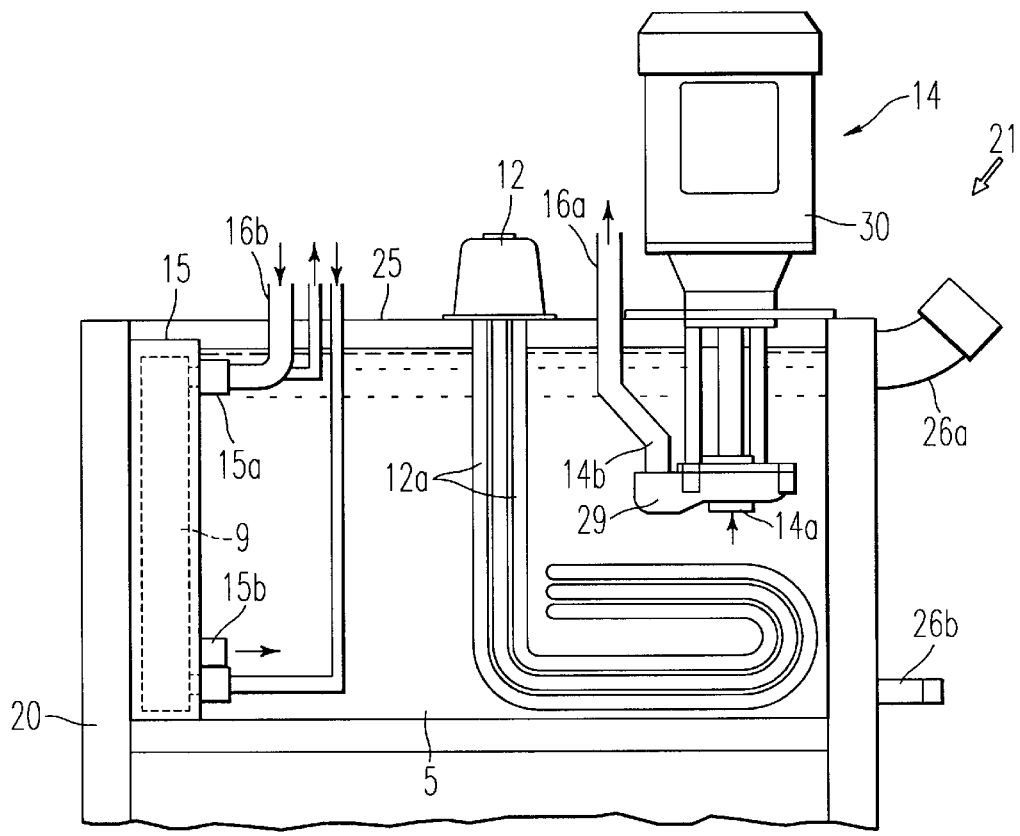
FIG. 10 is a cross-sectional view showing an enlarged integral part of FIG. 9.

FIGS. 1 and 2 show a first embodiment of this invention. The configuration of a constant-temperature liquid-circulating apparatus 31A according to the first embodiment is substantially the same as that of a constant-temperature liquid-circulating apparatus 21 shown in FIGS. 9 and 10, except for the configuration related to a heater 12. Thus, the same main components in the figures have the same reference numerals, and their detailed description is omitted.

According to the first embodiment, a cylindrical casing 33 that defines a heating chamber in a tank 25 in which a pump 14 and a heat exchanger 15 are incorporated is vertically mounted on the inner bottom surface of the tank 25. The casing 33 is shaped like a cylinder or prism, its lower end is occluded, and its upper end is open. Its height is somewhat less than the depth of the tank 25.

The heater 12 has a linear heat-generating section 12a formed so that its length is somewhat less than the depth of the tank 25, and is mounted at the top of the tank 25 in such a way that its heat-generating section 12a is vertically inserted into the casing 33 from above. The heating section of the heater 12 is almost entirely accommodated in the casing 33.

An inlet 36 for a constant-temperature liquid is provided at the lower end of the casing 33, while an outlet 37 is provided at the upper end. The inlet 36 is connected to an outlet 15b of the heat exchanger 15 by piping 34, while the outlet 37 is directly opened into the tank 25. Thus, a constant-temperature liquid 5, which has been cooled by the heat exchanger 15, is fed from the inlet 36 into the casing 33 to fill it, and then overflows from the outlet 37 into the tank 25 while being heated by the heater 12.

A through-hole 33a allowing the casing 33 and tank 25 to communicate with each other is provided at the lower end of the casing 33. The through-hole 33a is used to discharge the constant-temperature liquid 5 from the casing 33 into the tank 25 when the operation of the apparatus is stopped, and has a smaller cross section than the inlet 36. This configuration serves to reduce the amount of constant-temperature liquid flowing out through the through-hole 33a to a level below that of the constant-temperature liquid fed into the casing 33 from the inlet 36 during the operation of the apparatus, thereby allowing the apparatus to operate smoothly.

A pump head 29 containing a suction port 14i aand an ejection port 14b of the pump 14 is disposed near the bottom surface of the tank 25 at a low position. A minimum amount of constant-temperature liquid 5 required to be cyclicly supplied to a load 2 by the pump head 29 is accommodated in the tank 25. A sufficient amount of constant-temperature liquid 5 is such that, during operation, the level of the constant-temperature liquid 5 in the tank 25 is approximately half the height of the casing 33.

When the level of the constant-temperature liquid 5 is set low, the tank 25 will have a sufficient capacity to collect and house the constant-temperature liquid in external piping and devices during maintenance, thereby enabling easy maintenance.

In a constant-temperature liquid-circulating apparatus 31 having the above configuration, the constant-temperature liquid 5 in the tank 25 is circulated through a circulating circuit 3 by the pump 14 while a refrigerant for cooling is circulated through a refrigerating circuit 4.

After returning to an inlet 1a of the heat exchanger 15 from an outlet 2b of the load 2 through piping 16a, the hot constant-temperature liquid 5 is cooled by the refrigerant flowing through an evaporator 9 in the heat exchanger 15, and then flows into the casing 33 through the outlet 15b and piping 34. The constant-temperature liquid 5, which has flown into the casing 33, fills the inside of the casing 33 and then overflows from the outlet 37 at the upper end into the tank 25, while it is simultaneously heated by the heater 12.

As a result, the constant-temperature liquid 5 can be fed into the casing 33 and reliably heated by the heater 12 to prevent the heater 12 from being open-circuited due to unloaded heating or an excessive temperature increase, regardless of the level of the constant-temperature liquid 5 in the tank 25, even if its amount is reduced. Furthermore, this embodiment can reduce the amount of expensive constant-temperature liquid used, thereby reducing initial costs.

In addition, a compact constant-temperature liquid-circulating apparatus that is easy to maintain can be obtained by incorporating the pump 14, heat exchanger 15, and heater 12 in the tank 25. Furthermore, the heater 12 is mounted at the top of the tank 25 to prevent the liquid from leaking from the mounting portion of the heater 12.

The temperature of the constant-temperature liquid 5 in the tank 25 is detected by a temperature sensor 17 near the suction port 14i aor ejection port 14b of the port 14, and the heater 12 is controlled by a temperature controller 18 to bring the detected temperature to the value set by the temperature controller 18.

Figure 3:
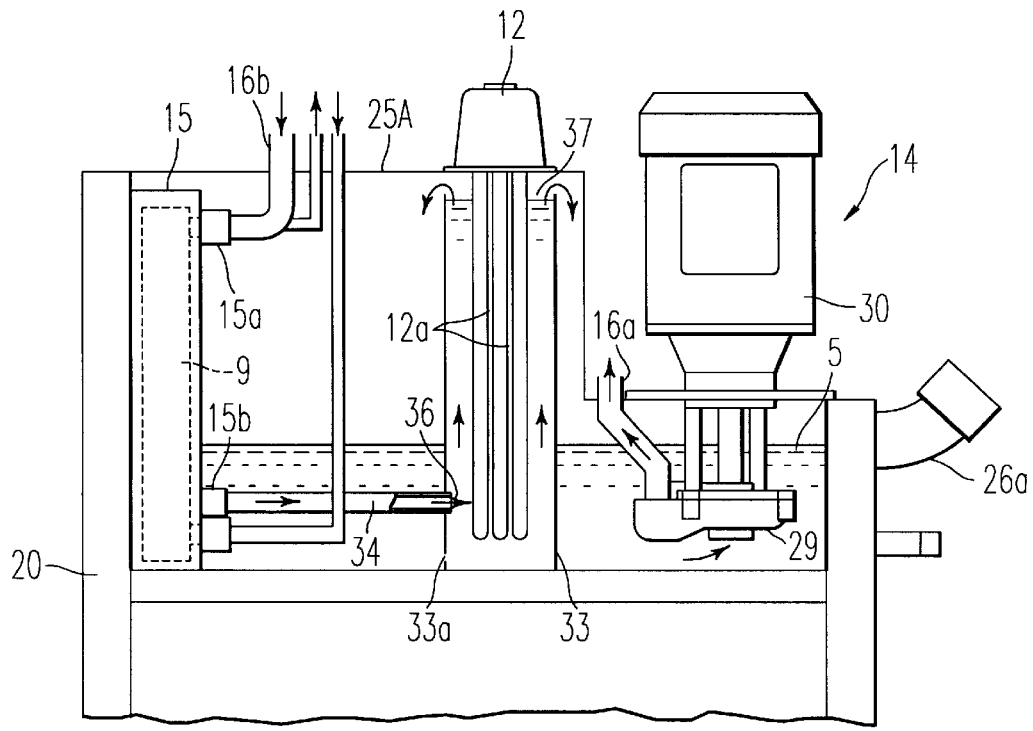
FIG. 3 is a cross-sectional view showing one variation of the first embodiment.

FIG. 3 shows one variation of the first embodiment. Since this variation can reduce the level of the constant-temperature liquid in the tank 25, the installation surface for the pump 14 in the tank 25 is positioned below that of the installation surface for the heater 12 so as to allow a space lateral to the heater 12 to be used as an installation space for a motor 30 for the pump 14.

The motor 30 is generally lower than the heater 12, so it significantly protrudes from the top of the tank 25, thereby requiring the size of the apparatus to be increased. By installing the motor 30 at a low position, however, it is prevented from protruding from the top of the tank 25, thereby enabling the circulating device to be made compact and also reducing the length of the shaft.

Figure 4:
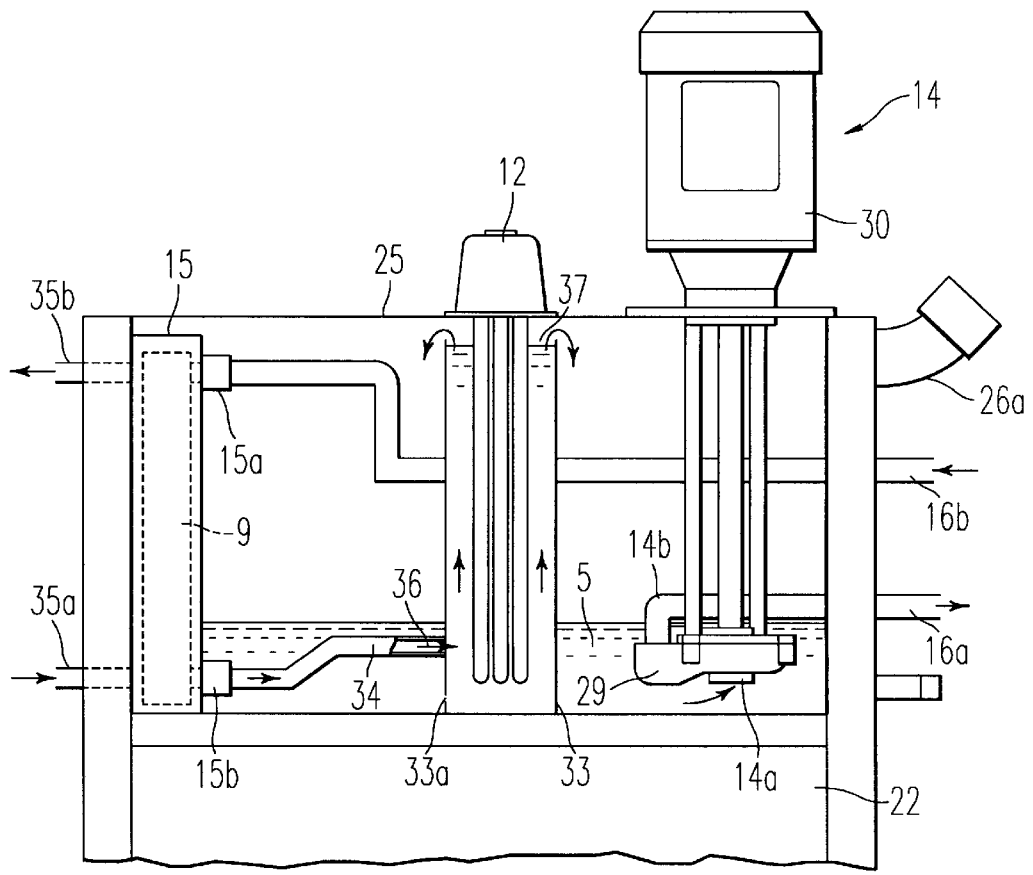
FIG. 4 is a cross-sectional view showing another variation of the first embodiment.

FIG. 4 shows another variation of the first embodiment. The second variation effectively uses the internal space of the tank 25 for the piping. That is, the piping 16b connected to the inlet 1a of the heat exchanger 15 and the piping 16a connected to the ejection port 14b of the pump 14 are drawn out from one side of the tank 25 through the upper space of the tank 25, while the inlet-side piping 3a and outlet-side piping 35b from the evaporator 9 are drawn out from the other side of the tank 25.

With this configuration, the piping is prevented from being mistakenly connected to the heat exchanger 15 and the cover of the tank 25 can be more tightly closed.

Figure 5:
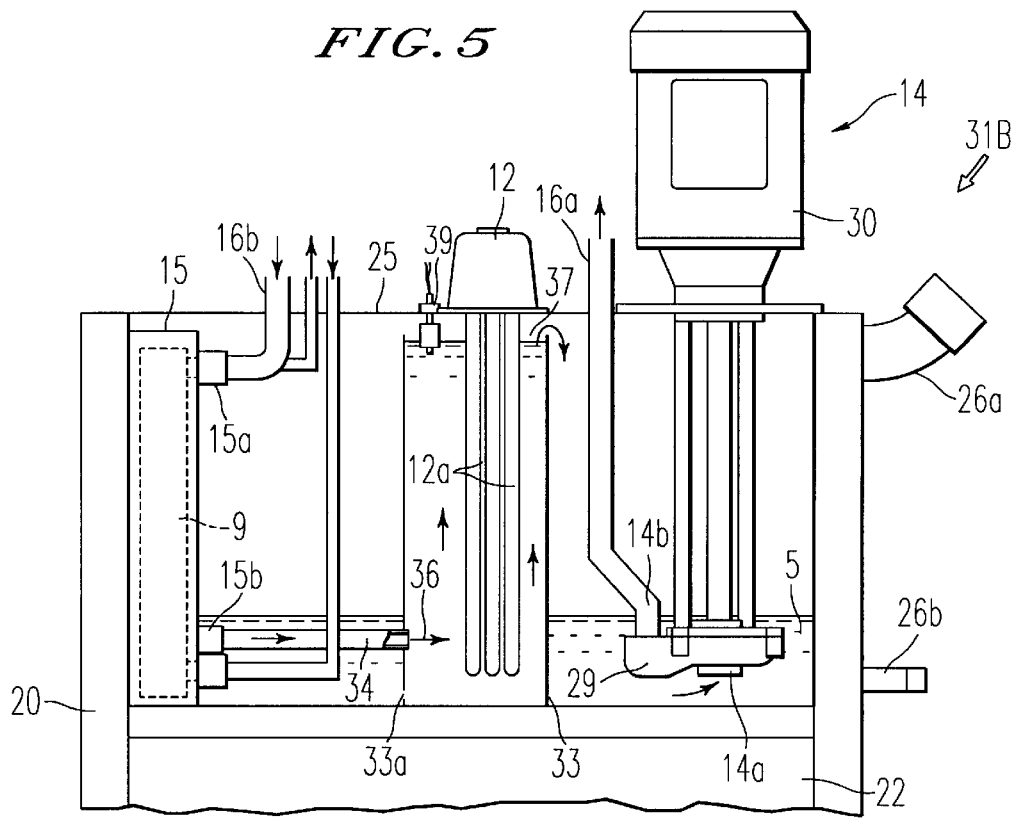
FIG. 5 is a cross-sectional view showing an integral part of a second embodiment of this invention.

FIG. 5 shows a second embodiment of this invention. In a constant-temperature circulating apparatus 31B according to the second embodiment, a float switch 39 is attached to the upper end of the casing 33 for use as a level sensor. The float switch 39 is turned on to conduct electricity through the heater 12 via the temperature controller 18 when the constant-temperature liquid 5 fills the inside of the casing 33 and overflows from the outlet 37. It is turned off to stop supplying electricity to the heater 12 if the level of the constant-temperature liquid in the casing 33 decreases.

This configuration enables the heater 12 to be turned off to reliably prevent unloaded heating or an excessive increase in temperature if the level of the constant-temperature liquid in the casing 33 decreases due to any unforseen accident, or if the operation of the apparatus is stopped to discharge the constant-temperature liquid from the casing 33 into the tank 25.

The other configuration of the second embodiment is substantially the same as that of the first embodiment. Thus, the same main components in the figures have the same reference numerals and their description is omitted.

The level sensor is not limited to the float switch 39 shown in the figure, and other sensors can be used, provided that they can detect the level in the casing 33 to output a relevant signal to the heater 12.

Figure 6:
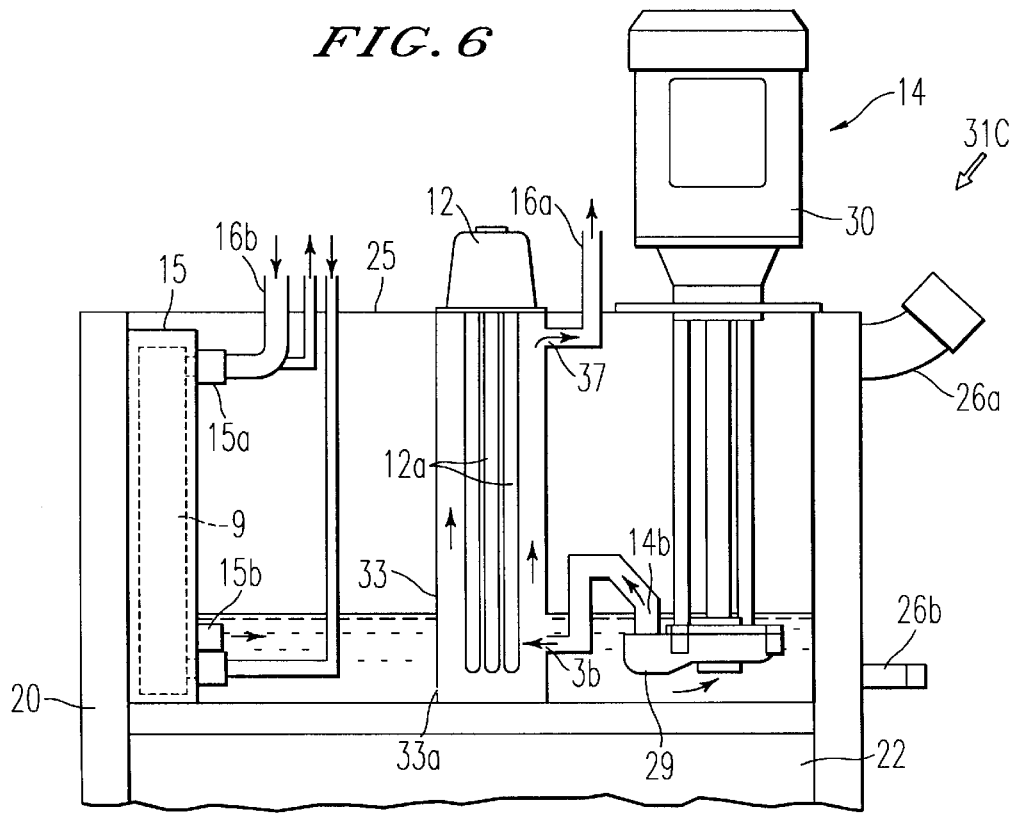
FIG. 6 is a cross-sectional view showing an integral part of a third embodiment of this invention.

FIG. 6 shows a third embodiment of this invention. In a constant-temperature liquid-circulating apparatus 31C according to the third embodiment, the inlet 36 of the casing 33 is connected to the ejection port 14b of the pump 14, the outlet 37 is connected to the load by the piping 16a, and the outlet 15b of the heat exchanger 15 is opened into the tank 25, so that the constant-temperature liquid 5 that has been heated in the casing 33 is directly supplied to the load 2.

The other configuration of the third embodiment is substantially the same as that of the first embodiment. Thus, the same main components in the figures have the same reference numerals and their description is omitted.

Figure 7:
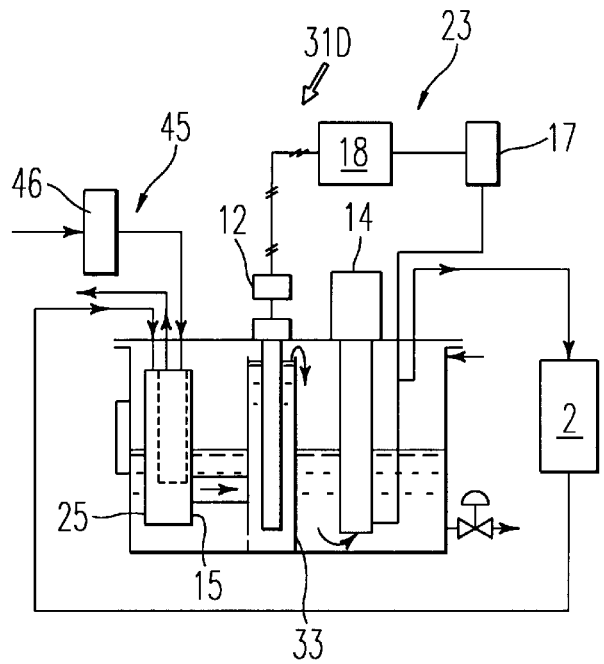
FIG. 7 is a cross-sectional view showing an overall configuration of a fourth embodiment of this invention.
Figure 8:
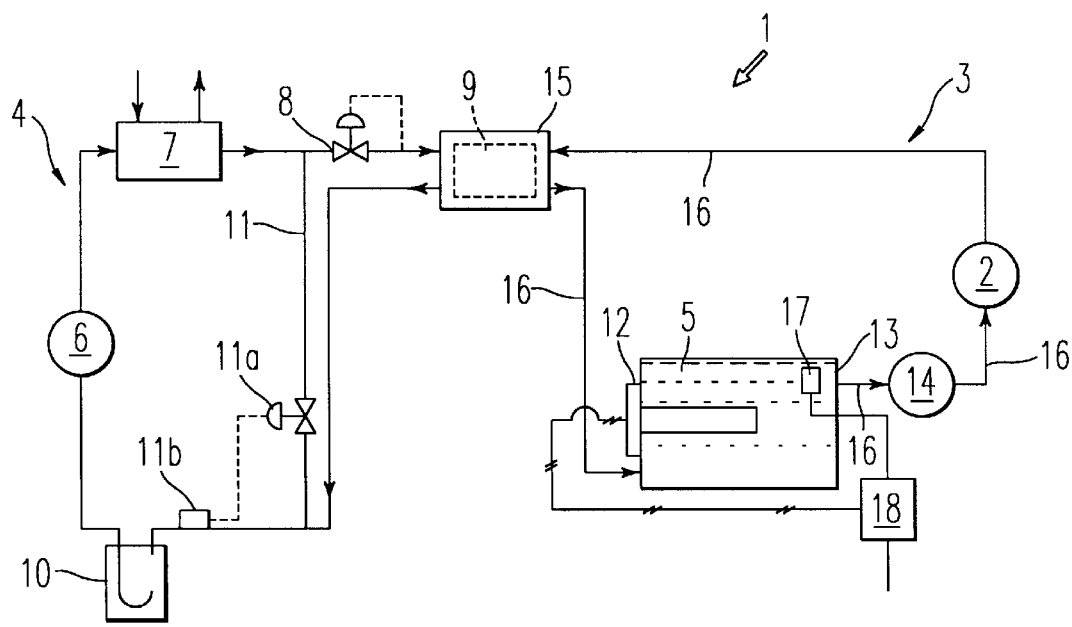
FIG. 8 shows an overall configuration of a publicly known constant-temperature liquid-circulating apparatus.

FIG. 7 shows a fourth embodiment of this invention. A constant-temperature liquid-circulating apparatus 31D according to the fourth embodiment uses a fluid such as water as a means for cooling the constant-temperature liquid, as opposed to the refrigerating circuit 4, which uses the latent heat obtained when the refrigerant changes between the gas phase and liquid phase. That is, a cooling-water supply means 45 is connected to the heat exchanger 15 so that cooling water supplied by the cooling-water supply means 45 cools the constant-temperature liquid 5.

The cooling-water supply means 45 supplies cooling water to the heat exchanger 15 using, for example, a pump (not shown), and the flow of cooling water is controlled by a flow controller 46.

The other configuration and operation of the fourth embodiment are substantially the same as those of the first embodiment. Thus, the same main components in the figures have the same reference numerals and their description is omitted.

By configuring the apparatus to cool the constant-temperature liquid using cooling water, the need for an expensive refrigerating circuit 4 of a complicated structure is eliminated, enabling a constant-temperature liquid-circulating apparatus to be inexpensively configured.

In the first to third embodiments, the cooling-water supply means 45 can also be used instead of the refrigerating circuit 4.

What is claimed is:

1. A constant-temperature liquid-circulating apparatus having a tank for accommodating a constant-temperature liquid; a pump for cyclicly supplying the constant-temperature liquid in the tank to a load; a temperature sensor for detecting the temperature of the constant-temperature liquid; a temperature controller that compares the temperature detected by the temperature sensor to the set temperature in order to control the heater to adjust the detected temperature to the set value; said heater including a heating section for heating the constant-temperature liquid; and a first heat exchanger for cooling the constant-temperature liquid that has increased in temperature due to the cooling of the load, wherein:

said tank incorporates said pump and said first heat exchanger and includes a casing that defines a heating chamber, wherein said heater is mounted at the top of the tank in such a way that the heating section is inserted into the casing, and wherein an inlet for the constant-temperature liquid is provided at the lower end of the casing, while an outlet is provided at the upper end;

wherein said casing is cylindrical in shape and is vertically mounted on the bottom surface of the tank in such a way that its lower end is immersed in the constant-temperature liquid in the tank while the upper end protrudes from the top of the constant-temperature liquid, wherein a through-hole with a smaller cross section than said inlet that allows the casing and tank to communicate with each other is provided at the lower end of the casing, and wherein the heating section of said heater is linear and is vertically inserted into said casing from above.

2. An apparatus according to claim 1 wherein a pump head containing the suction and injection ports of said pump is disposed near the bottom surface of said tank, wherein a minimum amount of said constant-temperature liquid required to be cyclicly supplied to the load by said pump head is accommodated in the tank, and wherein during operation, the level of the constant-temperature liquid in the tank is not more than half the height of said casing.

3. An apparatus according to any one of claims 1 or 2 wherein an inlet of said casing is connected to a heat exchanger while its outlet is opened into the tank, so that the constant-temperature liquid that has been cooled by the heat exchanger is fed into the casing from said inlet and heated by the heater, and then overflows from the outlet into the tank.

4. An apparatus according to claim 3 wherein said casing has a level sensor for detecting the level of the constant-temperature liquid in the casing to turn the heater on or off.

5. An apparatus according to any one of claims 1 or 2 wherein the inlet of said casing is connected to the pump while its outlet is connected to the load.

* * * * *